United States Patent [19]

Ekdahl, Jr. et al.

[11] Patent Number: 4,633,172
[45] Date of Patent: Dec. 30, 1986

[54] IN-LINE BEAM CURRENT MONITOR

[75] Inventors: Carl A. Ekdahl, Jr.; Charles A. Frost, both of Albuquerque, N. Mex.

[73] Assignee: The United States of America as represented by the United States Department of Energy, Washington, D.C.

[21] Appl. No.: 670,777

[22] Filed: Nov. 13, 1984

[51] Int. Cl.⁴ .......................................... G01R 19/00
[52] U.S. Cl. .................................. 324/126; 250/397; 324/71.3; 324/76 A
[58] Field of Search ................. 324/71.3, 76 R, 76 A, 324/126, 96; 250/397

[56] References Cited

U.S. PATENT DOCUMENTS

| 2,814,730 | 11/1957 | Fechter | 324/71.3 X |
| 3,239,664 | 3/1966 | Farrell | 324/71.3 X |
| 3,293,429 | 12/1966 | Leboutet et al. | 324/71.3 X |
| 3,359,500 | 12/1967 | Takeda et al. | 328/233 |
| 3,448,374 | 6/1969 | Heuer | 324/318 |
| 3,519,927 | 7/1970 | Holt | 324/71.3 X |
| 3,600,580 | 8/1971 | Vogel | 324/71.3 X |
| 3,784,909 | 1/1974 | Schutt et al. | 324/71.1 |
| 4,284,952 | 8/1981 | Fink | 324/71.3 X |
| 4,357,536 | 11/1982 | Varma et al. | 250/397 |
| 4,438,394 | 3/1984 | Ekdahl | 324/126 |

OTHER PUBLICATIONS

Pellinen, "A High Current, Subnanosecond Response Faraday Cup", Review of Scientific Instruments, vol. 41, #9, Sep. 1970.
Pellinen, D. et al., "A Technique to Measure High-Power Electron Beam Currents", Review of Scientific Instruments, vol. 44, No. 1, Jan. 1973, pp. 46-49.
Thornton, E. et al., "Development of an Intense Pulsed Relativistic Electron Beam of Large Diameter and Uniform Flux", J. Phys. E. (GB), vol. 6, No. 12, Dec. 1973, pp. 1223-1232.
Varma, M., "A Simple Heavy-Ion Beam Monitor", Nuclear Instruments and Methods, vol. 133, No. 2, Mar. 1976, pp. 205-207.

Primary Examiner—Reinhard J. Eisenzopf
Assistant Examiner—Stephen M. Baker
Attorney, Agent, or Firm—George H. Libman; Albert Sopp; Judson R. Hightower

[57] ABSTRACT

An intense relativistic electron beam current monitor for a gas neutralized beam transport line includes a first foil for conducting plasma current to the wall where it is measured as it traverses an inductive loop formed by a cavity in the wall. An insulator foil separates the first foil from a second conducting foil which returns the current to the plasma environment.

10 Claims, 4 Drawing Figures

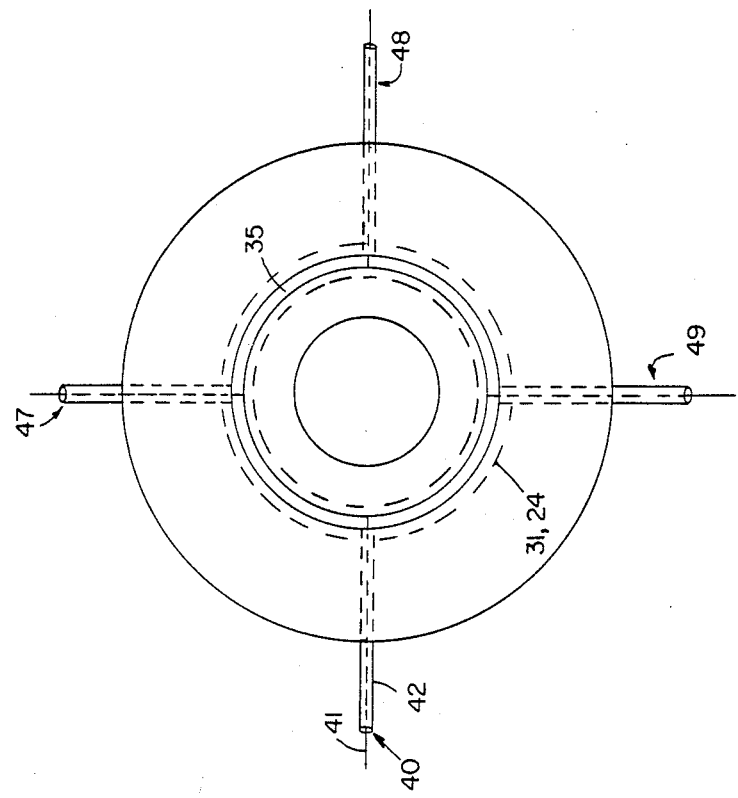
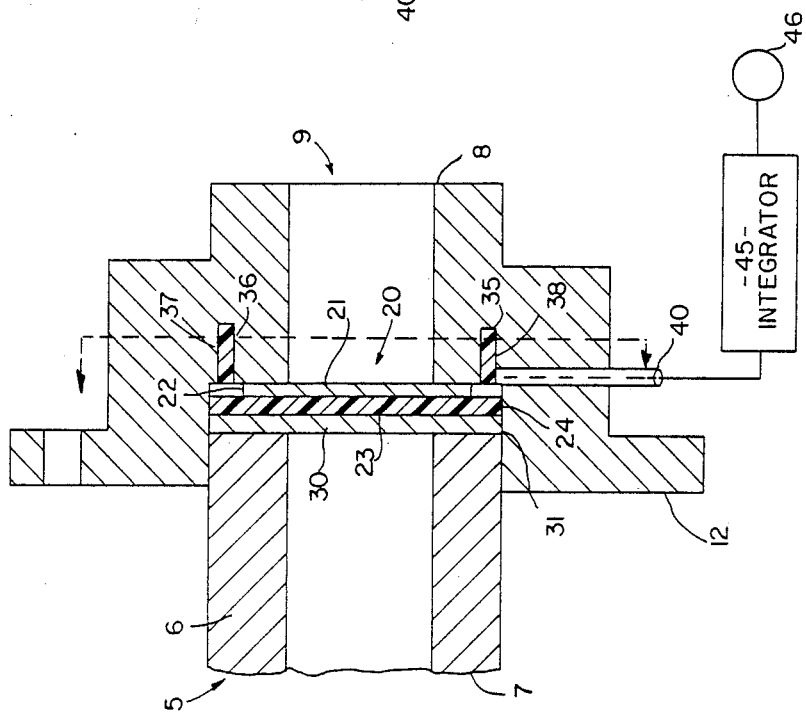
FIG. 2
FIG. 1

IN-LINE BEAM CURRENT MONITOR

The U.S. Government has rights in this invention pursuant to contract number DE-AC04-76DP00789 between the Department of Energy and AT&T Technologies.

BACKGROUND OF THE INVENTION

The present invention relates generally to a pulsed current monitor and more particularly to an in-line monitor for measuring the beam current pulse of an intense relativistic electron beam (IREB).

Intense relativistic electron beams are useful for applications in fusion and plasma physics research, X-ray production for radiography, electron beam physics research, beam propogation studies, collective ion acceleration, material science, laser physics, and, especially, electron beam accelerator technology. Although suitable monitors have existed for low current beams in vacuum transport lines, previous monitors could not accurately characterize fast rising, high current, beam pulses in gas transport lines without physically stopping the beam. If the beam is stopped, it is not available further down-stream for experiments. A Faraday cup monitor is one such prior art device for measuring these high current electron beams.

IREB current is the flow of high energy electrons (energy greater than 100 KeV). This current is difficult to measure in gas neutralized transport lines which propagate an IREB because these lines also have high plasma currents due to the flow of low energy plasma electrons being released by gas ionizations. These currents may interfere with the desired beam current measurements. Previous in-line monitors in gas neutralized beam transport lines, such as the monitor shown in U.S. Pat. No. 4,438,394 by one of the inventors, measure net current ($I_n$), which current is the sum of the beam current $I_b$ plus the plasma current $I_p$. However, in order to provide an accurate measurement of beam current, a way is needed to separate $I_b$ from $I_p$ without stopping the beam.

SUMMARY OF THE INVENTION

It is an object of this invention to provide an in-line current monitor that measures total beam current rather than net current.

It is another object of this invention to provide a inline beam current monitor that operates in gas neutralized transport lines without a separate vacuum section.

It is still another object of this invention to provide an in-line current monitor utilizing a radial transmission line to block low energy plasma electrons while passing high energy beam electrons.

It is also on object of this invention to provide an extremely fast current monitor for measuring fast rising beam currents.

It is a further object of this invention to provide an in-line beam current monitor that does not suffer electrical breakdown with high rates of rise of beam current.

Additional objects, advantages and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the in-line intense relativistic electron beam current monitor of this invention may comprise a plasma filled, electrically conductive tube for carrying a high energy IREB current and the associated low energy plasma current $I_p$ and net wall current $I_w$. A filter passes the high energy beam current but diverts the low energy plasma current to the wall where it is combined with the wall current. In one embodiment, the measurement is taken as the voltage across an inductive loop formed by an annular cavity or groove in the wall of the tube. For azimuthally symmetric current flow, the voltage across the groove at any point is equal to the time rates of change of the magnetic flux contained in the groove outside of the measuring point, which voltage is equal to the product of the groove inductance and the time rate of change of the total current (beam plus return) flowing inside of the measuring point. By forcing the return current to flow outside the measuring point, a beam current measurement is obtained.

BRIEF DISCRIPTION OF THE DRAWINGS

The accompanying drawings, which are incorporated in and form a part of the specification, illustrate an embodiment of the present invention and, together with a description, serve to explain the principles of the invention.

FIG. 1 is a cut-away plan view of a current monitor in accordance with this invention.

FIG. 2 is a sectional view of FIG. 1.

DETAILED DISCRIPTION OF THE INVENTION

Figure 4:
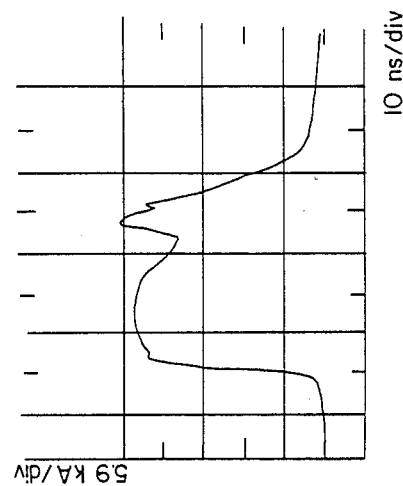
FIG. 4 shows an output measurement with this invention.

In accordance with the present invention, in-line beam current monitor for intense relativistic electron beams works on the principle that the total return current (plasma current $I_p$ plus wall current $I_w$) is equal and opposite to the beam current $I_b$. The invention transmits the magnetic flux to a fast current viewing inductor by a radial transmission line of low inductance. The current viewing inductor consists of a low inductance cavity in the form of a coaxial transmission line section shorted at one end. The cavity is configured as a shallow groove surrounding the beam line. In this manner, the cavity is totally shielded from noise pickup resulting from stray fields and sprayed charge. This groove may be conveniently cut in a flange plate which joins two beam line sections.

In accordance with a preferred embodiment of the invention as shown in FIG. 1, current monitor 1 includes a tube 5 having electrically conductive wall 6 surrounding a passage 9. An IREB may be conducted through tube 5 from input end 7 towards output end 8. As shown in the figure, tube 5 may consist of two separate portions, at least one of which portions includes a flange 12. It is contemplated that the other portion of tube 5 could have a mating flange to fasten to flange 12, or flange 12 could be mounted to other structure as is well known in the art. However, to simplify the drawing, only flange 12 is illustrated.

Current monitor 1 further includes filter means for passing the IREB current from input end 7 to output end 8 of tube 5, and for diverting plasma current $I_p$ from output end 8 to wall 6 of tube 5. As shown, filter 20 includes a sandwich of first and second electrically conductive aluminium foils 21 and 30 separated by an insulated foil 23. This structure defines a radial transmission line extending over the entire open passage 9 and having an outer edge 22 of foil 21 in contact with wall 6 at output end 8 of tube 5. Outer edge 24 of insulating film 23 extends beyond outer edge 22 of the conductive foil 21, as does outer edge 31 of second foil 30. The principle function of insulating film 23 is to separate the two electrically conducting films; however, film 23 must be as thin as possible to prevent collision of the high energy electrons with the molecules of the film. A 1 mil Kapton film has been found to be satisfactory for practice of the invention.

FIG. 1 also shows means for measuring the combined plasma and wall currents which means includes a cavity 35 formed as an annular groove slit encircling passage 9 in wall 6 of tube 5. As shown, cavity 35 includes a first or inner cavity wall portion 36 and a second or outer cavity wall portion 37. First cavity wall portion 36 is electrically connected to tube wall 6 at input end 7 of tube 5 only through second cavity wall portion 37. Likewise, second cavity wall portion 37 is only connected to the output end 8 of tube 5 only through first cavity wall portion 36. This construction ensures that the combined return currents pass from output end 8 to input end 7 of tube 5 only if they go around the perimeter of cavity 35.

As described, cavity 35 forms an inductive loop for the return current. In order to measure the voltage across this loop, a two wire transmission line 40, which typically may be a coaxial cable, is arranged such that one conductor 41 is attached to an edge of the second cavity wall portion while the other conductor 42 is connected to the edge of the first cavity wall portion. Since the voltage across an inductor is the first derivative with respect to time of the current through the inductor, the other end of cable 40 is connected to a voltage integrator 45, and the output of the integrator is connected to an oscilloscope 46 or other means for displaying the voltage across cavity 35. In order to prevent arcing across cavity 35, the cavity is conveniently filled with an insulator such as silicone rubber 38.

In order that monitor 1 be as invisible as possible to the IREB, it is imperative that the plasma current be returned to passage 9 at input end 7 of tube 5. This current return is accomplished by outer edge 31 of second conducting foil 30 preferably extending at least as far as outer edge 24 of insulating film 23 to provide a current return path from second cavity wall portion 37 of cavity 35 to passage 9 at the input end of tube 5.

Figure 3:
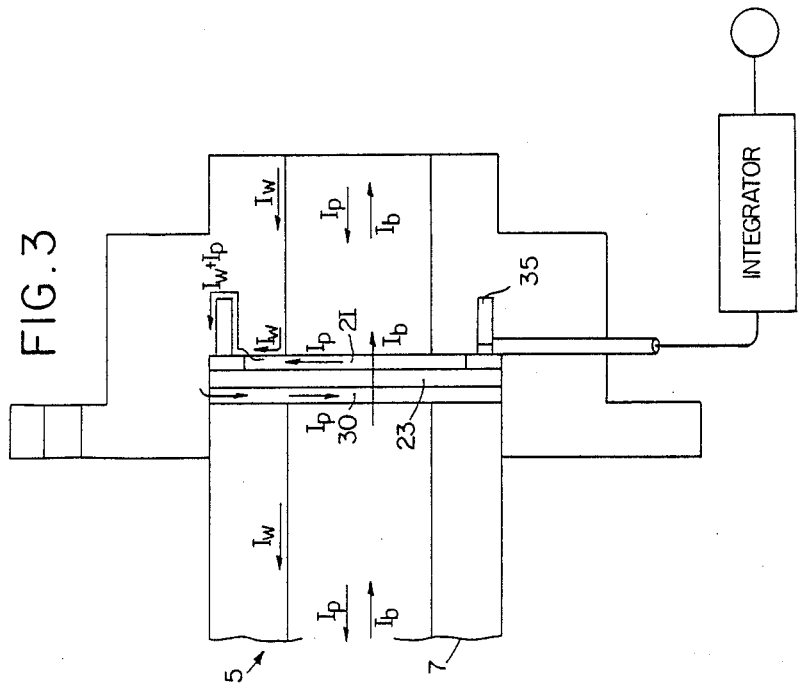
FIG. 3 shows current flow through the device of FIG. 1.

FIG. 3 is a cut-away view of the device of FIG. 1 without the cross-hatching of FIG. 1, thereby enabling probable current flow for a rising pulse to be shown. During the fall of the pulse these currents are reversed. It should be understood that the very high frequencies at which the device operates cause currents to flow near the surface of all conductors because of the well known "skin effect." For this reason, current $I_w$ follows the surface cavity of 35 instead of taking a more direct path to bypass the cavity. In addition, current $I_p$, once past cavity 35, follows the surface of foil 30 back to passage 9.

The operation of this device requires the high energy IREB to pass through the radial transmission line without significant alteration, but for low energy return currents to be diverted around cavity 35 for measurement. Accordingly, the thickness of foils 21 and 30 must be greater than the penetration range of the low energy plasma electrons and much less than the penetration range of the high energy electrons.

While the orientation of cavity 35 with respect to the monitor foils is not critical, the location of the foil edges with repect to the cavity is critical. In particular, edge 22 of first foil 21 must be located adjacent and electrically connected to first cavity wall portion 36 while outer edge 31 of second conductive foil 30 must be adjacent and electrically connected to the second cavity wall portion 37. Insulating film 23 must be sized to prevent either electrically conducting foil from touching the other foil and providing a current path which does not flow around cavity 35. In addition, insulating film 23 must be of sufficient strength to prevent arcing between the foils.

In a preferred embodiment, a one meV, 25 KA, 25 nsec IREB current pulse with a rise time less than 2 nsec was generated through a 2.2 cm tube. Foils 21 and 30 were constructed of 1 mil aluminum foil while insulating film 23 was constructed of 1 mil Kapton. Gap 38 had a width of 0.03 inch and a length of each cavity wall portion of 0.1 inch. The output of integrater 45 was measured on an oscilloscope and is shown at FIG. 4.

FIG. 2 shows a second embodiment of this invention wherein four two lead cables 40, 47, 48 and 49 are each connected across cavity 35 at locations evenly spaced around the perimeter of tube 5. This arrangement allows the location of the IREB within passage 9 to be determined, as an off-center beam will induce a larger voltage in those cables closer to the beam.

The invention has also been found to work with pulsed lasers which ionize gas in a transport tube containing an IREB. A feature of this laser embodiment is that insulating film 23 must be transparent to permit transmission of laser energy past filter 20. At the high frequencies involved, conducting films 21 and 30 may be omitted as plasmas are formed on each side of insulating film 23 which conduct the low energy currents as if conductive films 21 and 30 were present.

It should also be noted that the invention is bidirectional, as the IREB may also be transmitted from end 8 to end 7 of tube 5 with no change in performance from a pulse transmitted from end 7 to end 8.

The particular sizes in equipment discussed above are sited merely to illustrate a particular embodiment of this invention. It is contemplated that the use of this invention may involve components having different sizes and materials as long as the principle, using a thin conductor to divert plasma current to the wall where it combines with wall current to go around an inductive cavity to a second foil for return to the plasma environment, is followed. For example, cavity 35 may be replaced by an insulator separating input and output ends of tube 5 and a conventional current crewing resistor spanning the insulator for direct measurement of the voltage pulse. A monitor so constructed will provide a sensitive, convenient and inexpensive monitor for measuring IREB without destruction of the IREB. It is intended that the scope of this invention be defined by the claims appendent hereto.

We claim:

1. An in-line intense relativistic electron beam (IREB) current monitor comprising:
   a tube having an electrically conductive wall surrounding an open passage for carrying an IREB, said tube including an input end for receiving a high energy IREB current and an output end for receiving a total return current consisting of low energy plasma current $I_p$ and wall current $I_w$;

filter means for passing the IREB current from said input end to said output end through said open passage and for diverting the current $I_p$ from said passage;

means for combining the diverted current $I_p$ and the current $I_w$; and means for measuring the combined currents.

2. The IREB current monitor of claim 1 wherein said filter means comprises a radial transmission line extending over said entire open passage for conducting the current $I_p$ to said wall of said output end for combination with said current $I_w$.

3. The IREB current monitor of claim 2 wherein said means for measuring said combined currents comprises:

an electrically insulating cavity in said conductive wall between the input and output ends of said tube, said cavity encircling said open passage and being defined by connected first and second electrically conductive cavity wall portions, said first cavity wall portion being electrically connected to said tube wall at the input end of said tube only through said second cavity wall portion, said second cavity wall portion being electrically connected to said tube wall at the output end of said tube only through said first cavity wall portion; and means for measuring the voltage across said cavity.

4. The IREB current monitor of claim 3 wherein said means for measuring the voltage across said cavity comprises:

a two wire transmission line having one end of a first wire connected to said first cavity wall portion and one end of a second wire connected to said second cavity wall portion;

means connected to the other end of said first and second wires for integrating the voltage across said wires; and means for measuring said integrated voltage.

5. The IREB current monitor of claim 3 wherein said means for measuring the voltage across said cavity comprises:

a plurality of two wire transmission lines evenly spaced along said cavity around said open passage, each line having one end of a first wire connected to said first cavity wall portion and one end of a second wire connected to said second cavity wall portion;

means connected to the other end of each said transmission line for integrating the voltage between said wires; and means for measuring each integrated voltage; whereby the position of the IREB within said passage is indicated by the relative magnitudes of the measured voltages.

6. The IREB current monitor of claim 2 wherein said radial transmission line comprises:

first electrically conductive film means for conducting the current $I_p$ to said wall of said output end for combination with said current $I_w$;

second electrically conductive film means for conducting the current $I_w$ from said wall to the open passage at the input end of said tube; and insulating means for mechanically and electrically separating said first and second films.

7. The IREB current monitor of claim 3 wherein said radial transmission line comprises;

a first thin electrically conductive film having an outer edge in contact with said tube wall at the output end of said tube adjacent said first cavity wall portion; and a second thin electrically conductive film spaced from said first film by a thin electrically insulating film, the outer edge of said second film being in contact with said tube wall at the input end of said tube adjacent said second cavity wall portion.

8. The IREB current monitor of claim 4 wherein said cavity is filled with an electrically insulating material.

9. The IREB current monitor of claim 8 wherein said insulating material is silicone rubber.

10. The IREB current monitor of claim 6 wherein said first and second conductive films are formed of aluminum and said insulating film is formed of Kapton.

* * * * *